(12) United States Patent
Chang et al.

(10) Patent No.: US 10,784,265 B2
(45) Date of Patent: *Sep. 22, 2020

(54) SEMICONDUCTOR DEVICE (71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/273,057

(22) Filed: Feb. 11, 2019

(65) Prior Publication Data

US 2019/0189621 A1 Jun. 20, 2019

Related U.S. Application Data (62) Division of application No. 15/925,778, filed on Mar. 20, 2018, now Pat. No. 10,347,644.

(30) Foreign Application Priority Data

Mar. 28, 2017 (CN) .......................... 2017 1 0193278

(51) Int. Cl.
H01L 27/108 (2006.01)
H01L 21/768 (2006.01)

(52) U.S. Cl.
CPC .. H01L 27/10894 (2013.01); H01L 27/10808 (2013.01); H01L 27/10823 (2013.01);
(Continued)

(58) Field of Classification Search
None
See application file for complete search history.

(56) References Cited

U.S. PATENT DOCUMENTS 9,466,603 B2 10/2016 Yeom
10,186,513 B2 * 1/2019 Chang ............... H01L 27/10885
(Continued)

FOREIGN PATENT DOCUMENTS

CN 102543687 A 7/2012
CN 104347592 A 2/2015
(Continued)

*Primary Examiner* — Asok K Sarkar
(74) *Attorney, Agent, or Firm* — Winston Hsu (57) ABSTRACT

The present invention provides a semiconductor device including a semiconductor substrate with a memory cell region and a peripheral region, a gate line in the peripheral region, an etch-stop layer covering the gate line and the semiconductor substrate, a first insulating layer covering the etch-stop layer, two contact plugs disposed on the semiconductor substrate in the peripheral region, two pads disposed on the contact plugs respectively, and a second insulating layer disposed between the pads. The contact plugs are located at two sides of the gate line respectively, and the contact plugs penetrate through the etch-stop layer and the first insulating layer to contact the semiconductor substrate. The second insulating layer is not in contact with the etch-stop layer.

4 Claims, 8 Drawing Sheets

(52) U.S. Cl.
CPC .. *H01L 27/10852* (2013.01); *H01L 27/10855* (2013.01); *H01L 27/10876* (2013.01); *H01L 27/10885* (2013.01); *H01L 27/10891* (2013.01); *H01L 27/10897* (2013.01); *H01L 21/7682* (2013.01)

(56) References Cited

U.S. PATENT DOCUMENTS

| | | |
|---|---|---|
| 2014/0024183 A1 | 1/2014 | Hsu |
| 2014/0217545 A1 | 8/2014 | Kim |
| 2015/0035050 A1 | 2/2015 | Yeom |
| 2017/0069726 A1 | 3/2017 | Kye |
| 2018/0226410 A1 | 8/2018 | Chang |

FOREIGN PATENT DOCUMENTS

| | | |
|---|---|---|
| CN | 103579121 B | 8/2016 |
| CN | 106469725 A | 3/2017 |
| CN | 106504985 A | 3/2017 |
| CN | 108389861 A | 8/2018 |

\* cited by examiner

SEMICONDUCTOR DEVICE

CROSS REFERENCE TO RELATED APPLICATIONS

This application is a divisional application of and claims the benefit of U.S. patent application Ser. No. 15/925,778, filed Mar. 20, 2018, which claims the priority benefit of Chinese patent application serial no. 201710193278.9, filed Mar. 28, 2017. The entirety of the above-mentioned patent application is hereby incorporated by reference herein.

BACKGROUND OF THE INVENTION

1. Field of the Invention

The present invention relates to a semiconductor device and a manufacturing method thereof, and more particularly to a semiconductor device with air gap and a manufacturing method.

2. Description of the Prior Art

Conventional method for manufacturing a dynamic random access memory (DRAM) is to form transistors within a substrate, to electrically connect the transistors arranged along a same direction through a word line, and then disposing a bit line crossing the word line on the transistors. After that, a storage node contact may be connected to a source/drain region through a region surrounded by two of the word lines and two of the bit lines in order to avoid the storage node contact being electrically connected to the bit line or the word line. However, as the size of memory cell becomes smaller, a spacing between the bit line and the storage node contact becomes less, so that RC delay existing between the bit line and the storage node contact is higher, which affects the operation of the device.

For this reason, with the continuing trend toward smaller size of the memory cell, it is an objective in the art to reduce the RC delay effect between the bit line and the storage node contact.

SUMMARY OF THE INVENTION

It is therefore an objective of the present invention to provide a semiconductor device and a manufacturing method thereof to form an air gap between the bit line and the storage node contact, thereby reducing the RC delay effect between the bit line and the storage node contact.

According to an embodiment, the present invention provides a semiconductor device, including a semiconductor substrate, a gate line, an etch-stop layer, a first insulation layer, two contact plugs, two pads, and a second insulation layer. The semiconductor substrate has a memory cell region and a peripheral region. The gate line is disposed on the semiconductor substrate in the peripheral region. The etch-stop layer covers the gate line and the semiconductor substrate in the peripheral region. The first insulation layer covers the etch-stop layer. The contact plugs are disposed on the semiconductor substrate in the peripheral region and located at two sides of the gate line respectively, and the contact plugs penetrate through the etch-stop layer and the first insulation layer to contact the semiconductor substrate. The pads are disposed on the contact plugs respectively. The second insulation layer is disposed between the pads, and the second insulation layer is not in contact with the etch-stop layer.

According to an embodiment, the present invention provides a manufacturing method of a semiconductor device. First, a semiconductor structure is provided, in which the semiconductor structure includes a semiconductor substrate, a bit line structure, a first spacer, a sacrificial spacer, a storage node contact, and an insulation pattern, the bit line structure, the first spacer, the sacrificial spacer, the storage node contact and the insulation pattern are disposed on the semiconductor substrate, the bit line structure extends along a first direction, the first spacer is disposed between the sacrificial spacer and the bit line structure, and the sacrificial spacer is disposed between the first spacer and the storage node contact and between the first spacer and the insulation pattern. After that, a conductive layer is formed to cover the semiconductor structure. Later, the conductive layer is patterned to form a conductive pattern and expose the insulation pattern and apart of the sacrificial spacer. Subsequently, the sacrificial spacer is removed to form an air gap between the storage node contact and the first spacer. Then, the conductive pattern is patterned to form a storage node pad on the storage node contact.

In the present invention, the air gap is formed between the storage node contact and the bit line structure, such that the RC delay effect between the bit line structure and the storage node contact can be reduced. Also, the conductive layer for forming the storage node pad is utilized to cover the first insulation layer on the peripheral circuit, and the sacrificial spacer is exposed by one of the patterning processes for forming the storage node pad, so that the air gap can be formed under the condition that the peripheral circuit is not damaged. In addition, another one of the patterning processes for forming the storage node pad may be performed to form the storage node pad in the memory cell region and the pad in the peripheral region, so the semiconductor device of the present invention with the air gap and the peripheral circuit may be formed without adding extra process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved. It is noted that, for purposes of illustrative clarity and being easily understood by the readers, the number and dimension of each element shown in drawings of the present invention are only illustrative and are not intended to limit the scope of the present disclosure, and the number and dimension of each element and dimension ratio between elements may be different from that in real elements.

Figure 1:
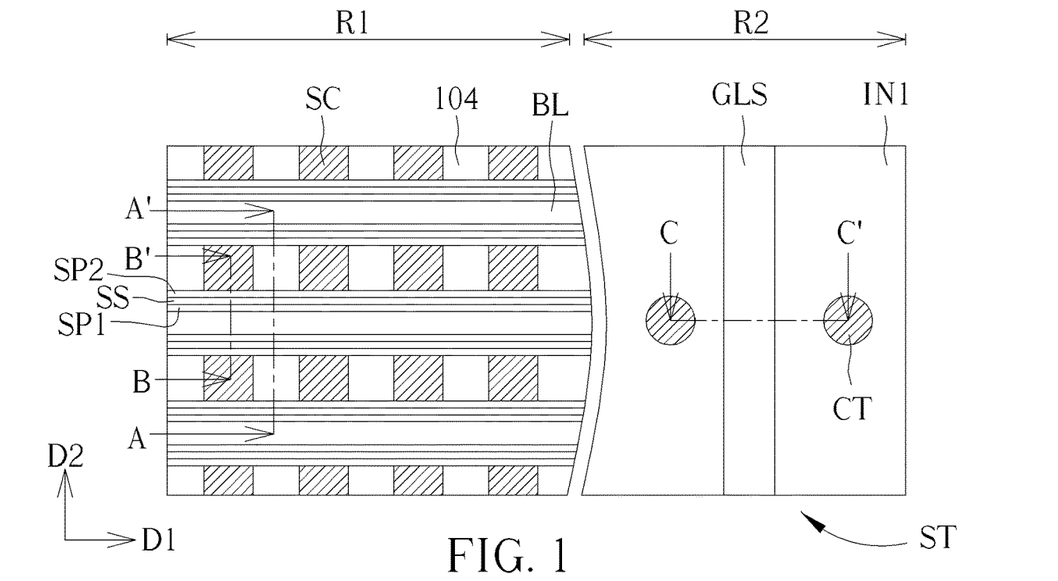
FIG. 1 to FIG. 12 schematically depict a manufacturing method of a semiconductor device according to an embodiment of the present invention.
Figure 2:
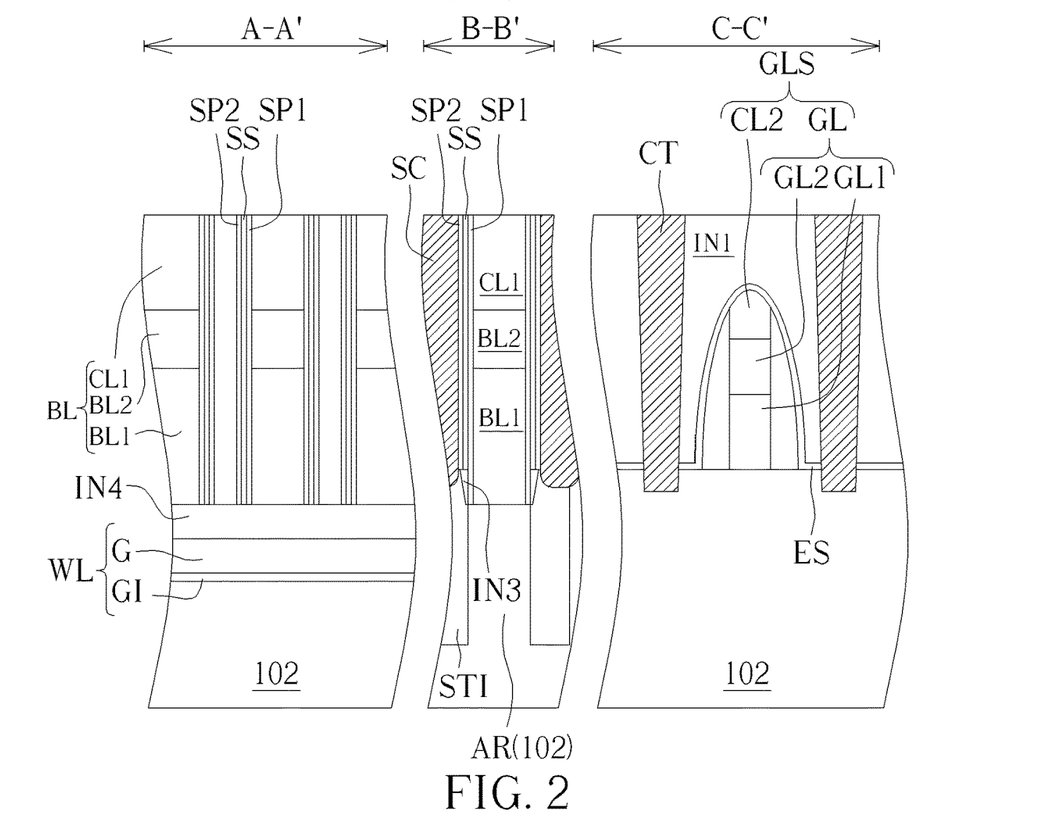
Figure 5:
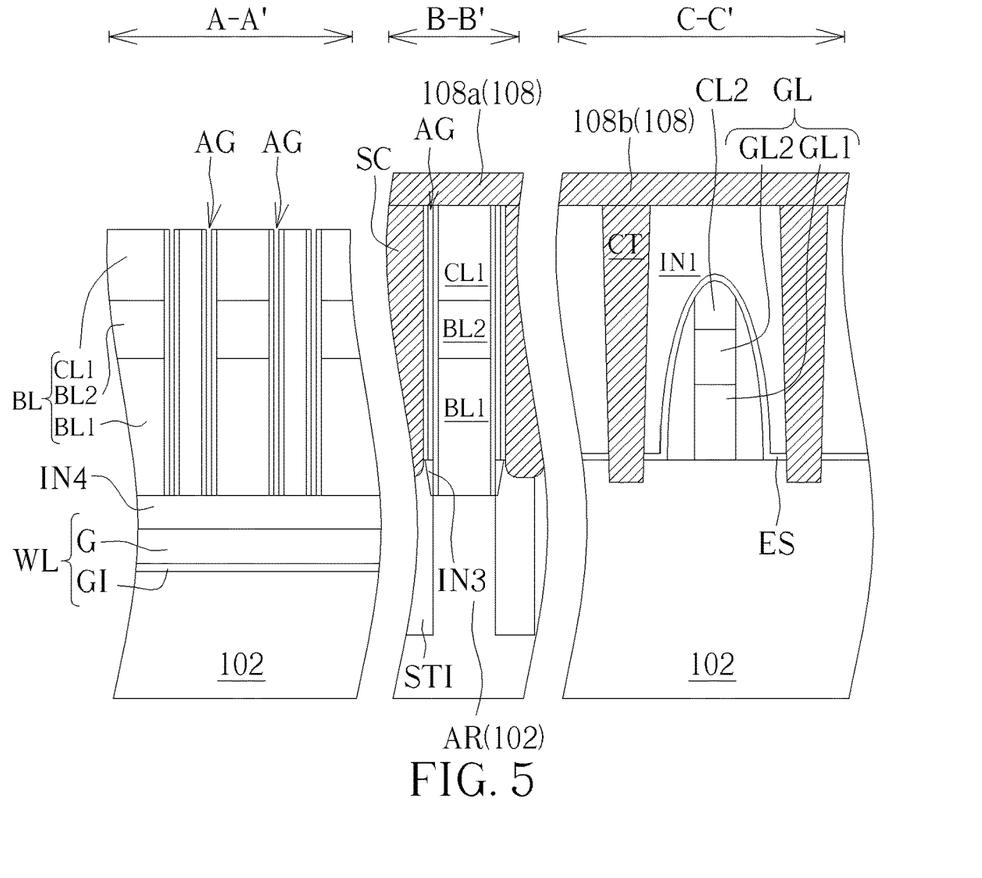
Figure 6:
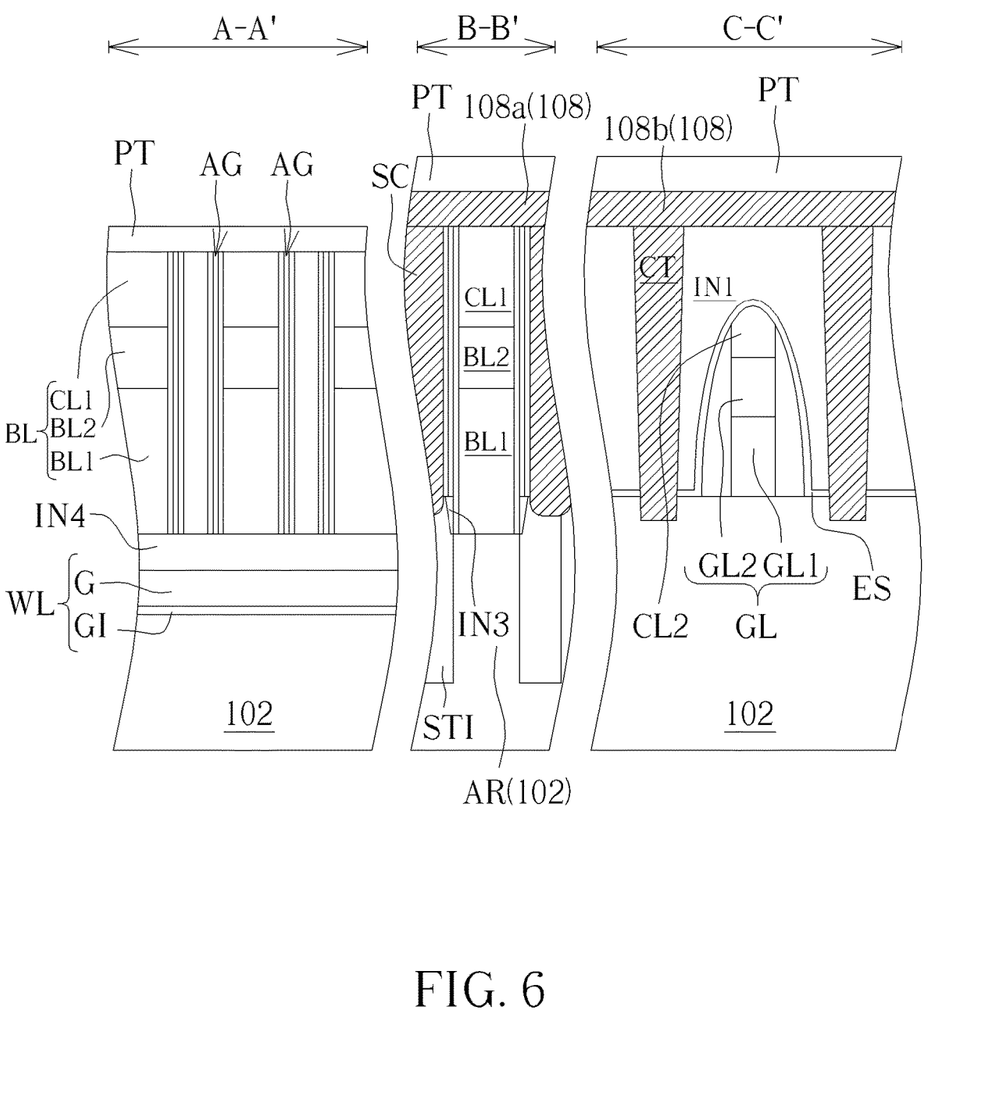
Figure 7:
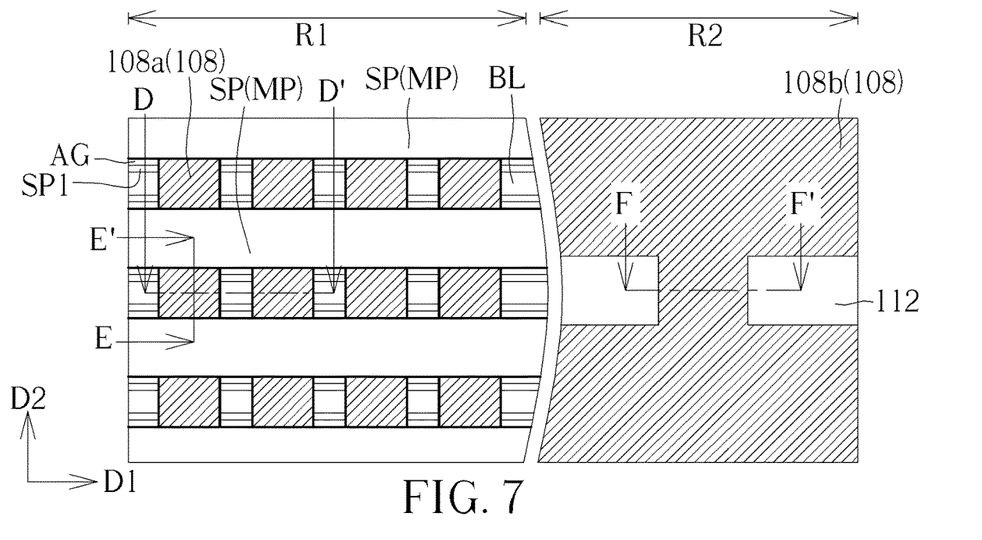
Figure 8:
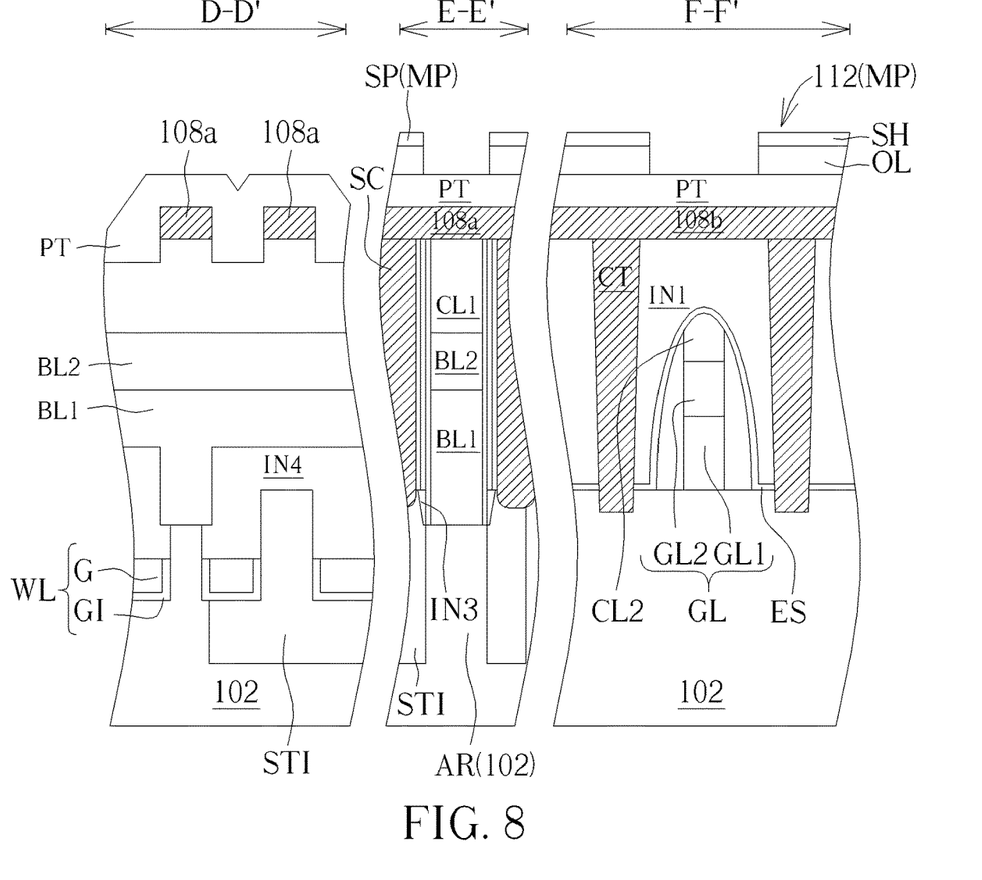
Figure 9:
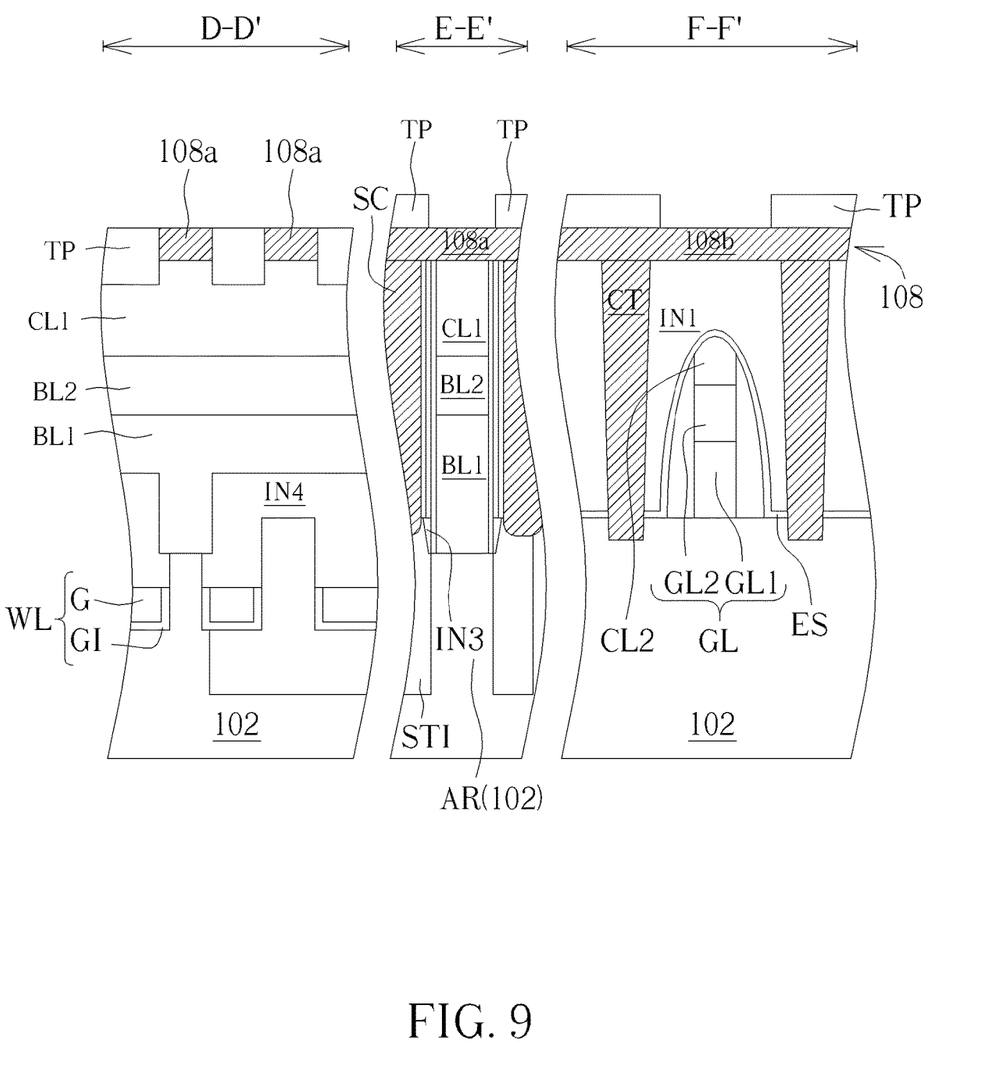
Figure 10:
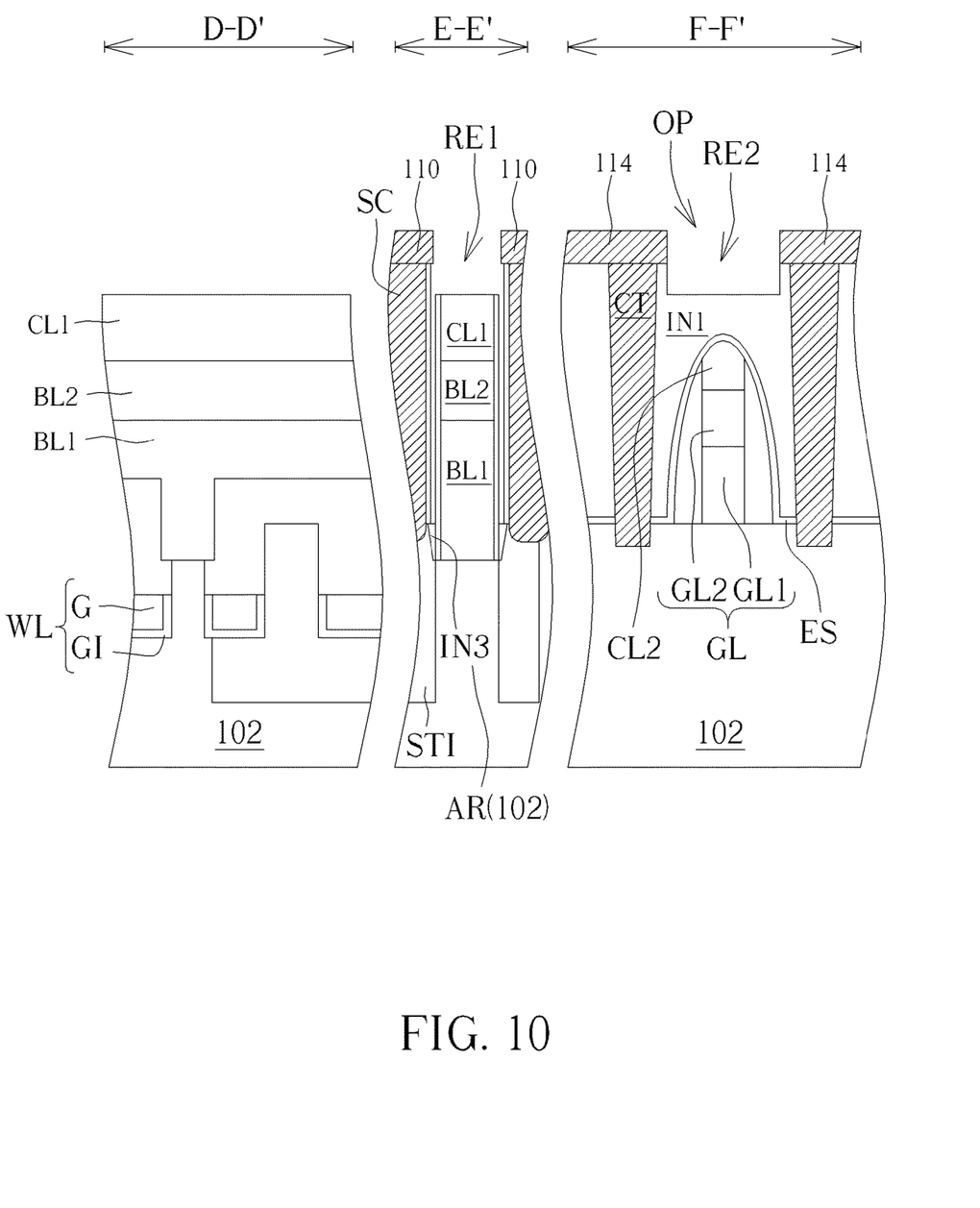
Figure 11:
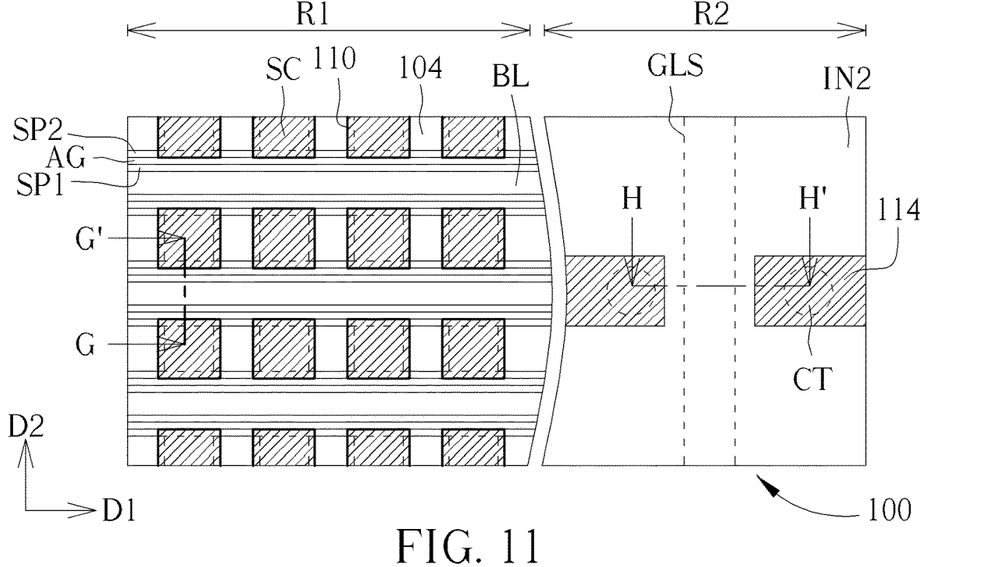
Figure 12:
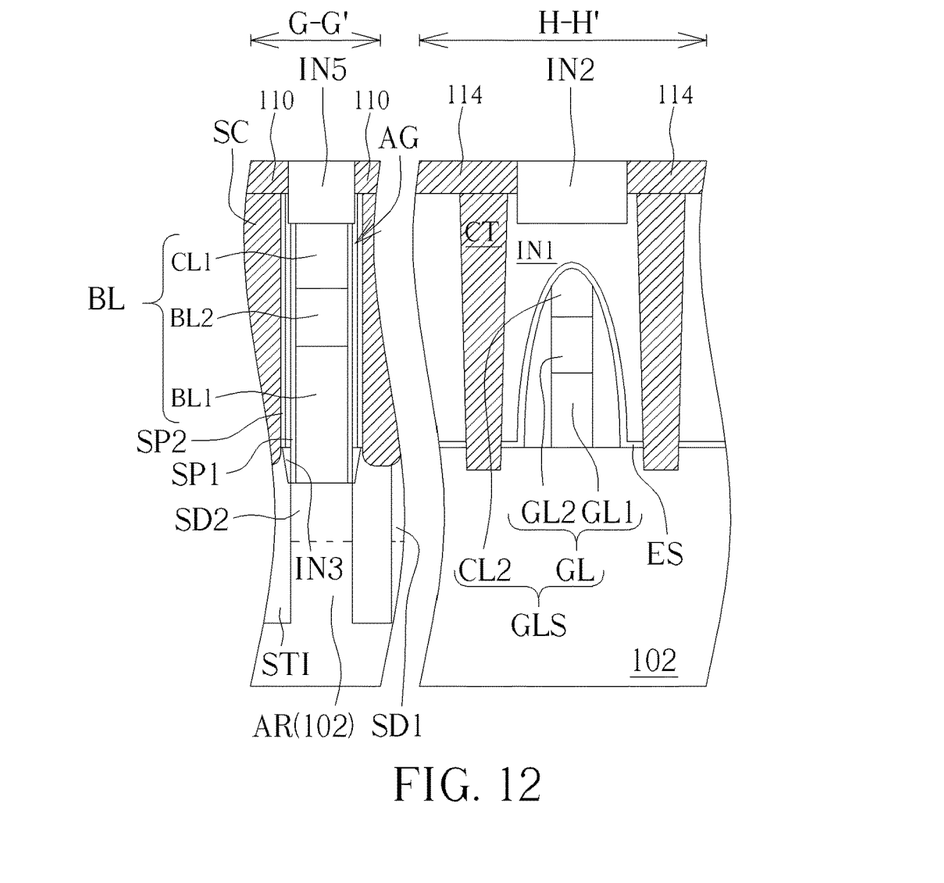

Referring to FIG. 1 to FIG. 12, which schematically illustrate a manufacturing method of a semiconductor device according to an embodiment of the present invention, in which FIG. 2 schematically illustrates a cross-sectional view taken along lines A-A', B-B' and C-C' of FIG. 1, FIG. 3, FIG. 5 and FIG. 6 respectively schematically illustrate different steps corresponding to the cross-sectional view taken along the lines A-A', B-B' and C-C' of FIG. 1, FIG. 8 schematically illustrates a cross-sectional view taken along lines D-D', E-E' and F-F' of FIG. 7, FIG. 9 and FIG. 10 respectively schematically illustrate different steps corresponding to the cross-sectional view taken along the lines D-D', E-E' and F-F' of FIG. 7, FIG. 11 schematically illustrates a top view of a semiconductor device according to an embodiment of the present invention, and FIG. 12 schematically illustrates a cross-sectional view taken along lines G-G' and H-H' of FIG. 11. As shown in FIG. 1 and FIG. 2, a semiconductor structure ST is provided first. In this embodiment, the semiconductor structure ST may include a semiconductor substrate 102, bit line structures BL, first spacers SP1, sacrificial spacers SS, storage node contacts SC, and insulation patterns 104. The bit line structures BL, the first spacers SP1, the sacrificial spacers SS, the storage node contacts SC and the insulation patterns 104 are disposed on the semiconductor substrate 102. Each bit line structure BL extends along a first direction D1, and the bit line structures BL are arranged along a second direction D2. For example, the first direction D1 may be perpendicular to the second direction D2, but not limited thereto. Each bit line structure BL may include a conductive layer with a single-layer structure or a multilayer structure. For example, each bit line structure BL may include two conductive layers BL1, BL2 stacked each other, the bottom conductive layer BL1 may for example include polysilicon or doped polysilicon, and the top conductive layer BL2 may for example include tungsten, aluminum, nickel or cobalt. Besides, each bit line structure BL may further include a first cap layer CL1 disposed on the top conductive layer BL2 for protecting the conductive layers BL1, BL2. The first cap layer CL1 may include a material with high etching selectivity ratio relative to the sacrificial spacer SS, such as silicon nitride, but not limited thereto.

In addition, each first spacer SP1 is disposed between one of the sacrificial spacers SS and one of the bit line structures BL, and each sacrificial spacer SS is disposed between one of the first spacers SP1 and one of the storage node contacts SC and between one of the first spacers SP1 and one of the insulation patterns 104. Specifically, the insulation patterns 104 may be arranged as an array formation, the storage node contacts SC may also be arranged as an array formation, the insulation patterns 104 in two adjacent rows may be located at two sides of one of the bit line structures BL, and the storage node contact SC in two adjacent rows may be located at two sides of one of the bit line structures BL. Also, each insulation pattern 104 and each storage node contact SC between any two adjacent bit line structures BL may be arranged along the first direction D1 alternately. Furthermore, two first spacers SP1 may be respectively formed on two sidewalls of each bit line structure BL, so each first spacer SP1 is located between one of the bit line structures BL and the storage node contacts SC in one row and also between one of the bit line structures BL and the insulation patterns 104 in one row. A sidewall of each first spacer SP1 may have one of the sacrificial spacers SS formed thereon, so that each sacrificial spacer SS is disposed between one of the first spacers SP1 and the storage node contacts SC in one row and between one of the first spacers SP1 and the insulation patterns 104 in one row. In this embodiment, the semiconductor structure ST may selectively further include a plurality of second spacers SP2, in which one of the second spacers SP2 is disposed between each sacrificial spacer SS and a corresponding one of the storage node contacts SC and between each sacrificial spacer SS and a corresponding one of the insulation patterns 104. A material of the first spacer SP1 and a material of the second spacer SP2 may respectively include a material with high etching selectivity ratio relative to the sacrificial spacer SS, for example the first spacer SP1 and the second spacer SP2 may include silicon nitride, and the sacrificial spacer SS may include silicon oxide, but the present invention not limited thereto. In another embodiment, the semiconductor structure ST may not include the second spacers, so that each sacrificial spacer SS may be in contact with the corresponding storage node contact SC and the corresponding insulation pattern 104.

In this embodiment, the semiconductor substrate 102 may has a memory cell region R1 and a peripheral region R2, in which the memory cell region R1 may be a region where memory cells utilized for storing charges are formed in, and the peripheral region R2 may be a region where transistors electrically connected to the memory cells or other peripheral circuits are formed in. The semiconductor structure ST under the bit line structures BL, the first spacers SP1, the sacrificial spacers SS, the storage node contacts SC and the insulation patterns 104 may include transistors. For example, each transistor may be a non-planar type transistor. In other words, the semiconductor substrate 102 in the memory cell region R1 may include a plurality of active regions AR extending along a direction. The semiconductor structure ST may further include device insulation layer STI and a plurality of word line structures WL, in which the device insulation layer STI surrounds each active region AR, and each word line structure WL is embedded in the semiconductor substrate 102 and extends along the second direction D2. Each active region AR is penetrated through by two adjacent word line structures WL. Each word line structure WL may include a gate G and a gate insulation layer GI, and the gate insulation layer GI is disposed between the gate G and the active region AR. A fourth insulation layer IN4 may be located between each word line structure WL and the bit line structures BL, so as to insulate the word line structures WL from the bit line structures BL. Each active region AR may respectively include two first source/drain regions SD1 and a second source/drain region SD2, in which each first source/drain region SD1 and the second source/drain region SD2 may be located at two sides of a corresponding one of the word line structures WL respectively. Each first source/drain region SD1 may be in contact with a corresponding one of the storage node contacts SC, and each second source/drain region SD2 may be in contact with a corresponding one of the bit line structures BL. Besides, the semiconductor structure ST may selectively further include a third insulation layer IN3 disposed between each sacrificial spacer SS and the device insulation layer STI, and a material of the third insulation layer IN3 may be formed of a material with high etching selectivity ratio relative to the sacrificial spacers SS, such as silicon nitride, but not limited thereto, such that the structure of the device insulation layer STI may be prevented from damage in the following steps for removing the sacrificial spacers SS. The transistors of the present invention are not limited to the above-mentioned structure. In another embodiment, each active region AR may be a fin structure protruding from a top surface of the semiconductor substrate 102. In another embodiment, each transistor may be planar type transistor. The person of ordinary skill in the art will understand the structure of the non-planar transistor, the structure of the planar transistor and the related variant designs, and they are not detailed redundantly.

In addition, the semiconductor structure ST of this embodiment may further include transistors of peripheral circuit in the peripheral region R2. For example, the transistor of the peripheral circuit may include a gate line structure GLS disposed on the semiconductor substrate 102 in the peripheral region R2, and a source and a drain (not shown) may be disposed in the semiconductor substrate 102 in the peripheral region R2 and located at two sides of the gate line structure GLS respectively. The gate line structure GLS may include a gate line GL and a second cap layer CL2, and the second cap layer CL2 is disposed on the gate line GL. The gate line GL may include two conductive layers stacked each other. For example, the bottom conductive layer GL1 may be formed at the same time as the bottom conductive layer BL1, the top conductive layer GL2 may be formed at the same time as the top conductive layer BL2, the second cap layer CL2 may be formed at the same time as the first cap layer CL1, and then an etching process is performed to form the gate line GL and each bit line structure BL, but the present invention is not limited thereto. Also, the semiconductor structure ST may further include an etch-stop layer ES, a first insulation layer IN1 and two contact plugs CT. The etch-stop layer ES is disposed on the semiconductor substrate 102 in the peripheral region R2 for protecting the transistors under the etch-stop layer ES. The contact plugs CT which are disposed on the semiconductor substrate 102 in the peripheral region R2 and located at two sides of the gate line GL respectively penetrate through the etch-stop layer ES and the first insulation layer IN1 to respectively be in contact with the source and drain in the semiconductor substrate 102 in the peripheral region R2. The first insulation layer IN1 may include a material identical to the sacrificial spacer SS, such as silicon oxide, but not limited thereto.

Figure 3:
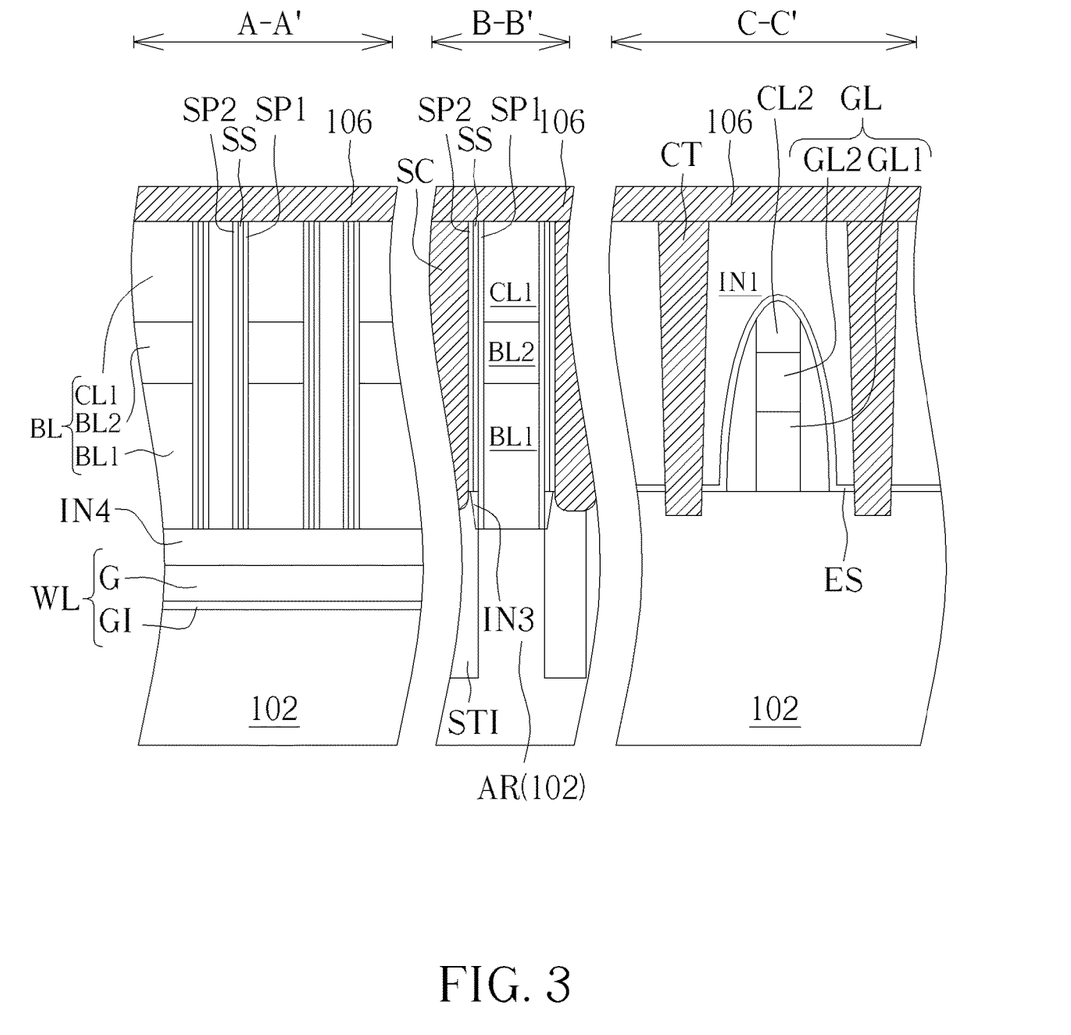

As shown in FIG. 3, a conductive layer 106 is formed to cover the semiconductor structure ST. Specifically, the conductive layer 106 covers the bit line structures BL, the first spacers SP1, the sacrificial spacers SS, the storage node contacts SC and the insulation patterns 104 in the memory cell region R1 and also covers the first insulation layer IN1 and the contact plugs CT in the peripheral region R2. The conductive layer 106 may, for example but not limited thereto, include tungsten.

Figure 4:
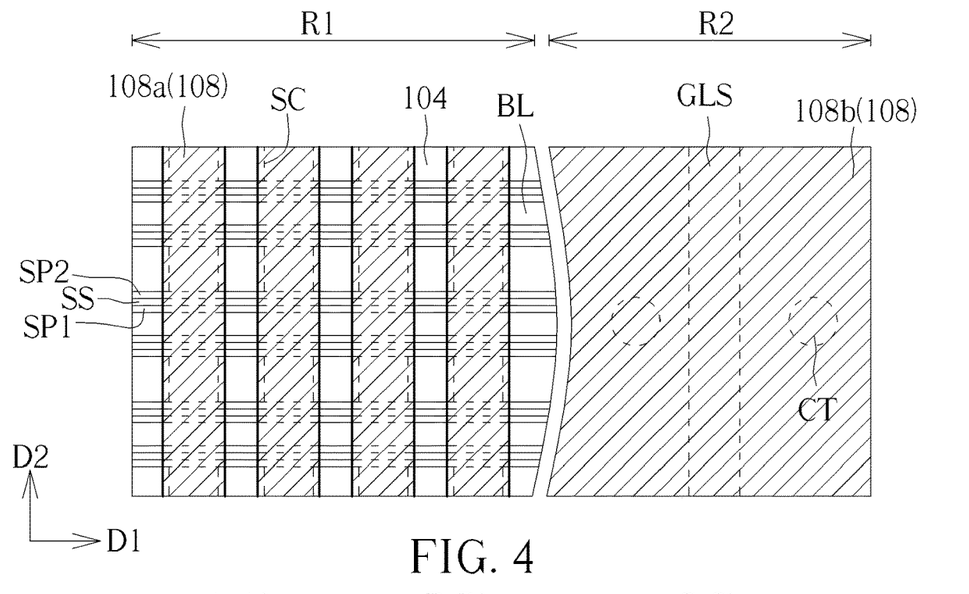

As shown in FIG. 4, after forming the conductive layer 106, the conductive layer 106 is patterned to form a conductive pattern 108 and expose the insulation patterns 104 and a part of each sacrificial spacer SS. In this embodiment, the conductive pattern 108 may include a plurality of conductive strips 108a extending along the direction D2 and crossing the bit line structures BL, and each conductive strip 108a is located on the storage node contacts SC in one column, so that parts of each bit line structure, parts of each first spacer SP1, parts of each sacrificial spacer SS and the insulation patterns 104 can be exposed while the conductive pattern 108 is formed, but the present invention is not limited thereto. It is noted that the conductive layer 106 on the first insulation layer IN1 in the peripheral region R1 is not patterned in this step, such that the conductive pattern 108 may further include a conductive block 108b covering the first insulation layer IN1 and the contact plugs CT in the peripheral region R2, and the first insulation layer IN1 is not exposed. In another embodiment, each conductive strip 108a may extend along the first direction D1 and be located between two adjacent bit line structures BL, and each conductive strip 108a may be disposed on the storage node contacts SC in one row. With this arrangement, each bit line structure BL, each first spacer SP1 and each sacrificial spacer SS may be fully exposed.

As shown in FIG. 5, after the step of forming the conductive pattern 108, a first etching process is performed to remove part of each sacrificial spacer SS not covered by the conductive strips 108a, so as to form an air gap AG between each storage node contact SC and the corresponding first spacer SP1. Specifically, since each sacrificial spacer SS extends along a sidewall of each bit line structure BL, not only the exposed part of each sacrificial spacer SS is removed, but also the sacrificial spacers SS under the conductive strips 108a may be removed in the first etching process. It is noted that because the conductive layer 106 in the peripheral region R2 is not removed, the conductive block 108b can protect the first insulation layer IN1 in the first etching process, such that the first insulation layer IN1 is not removed.

As shown in FIG. 10, after the step of removing the sacrificial spacers SS, the conductive pattern 108 is patterned to form a storage node pad 110 on each storage node contact SC. In this embodiment, the step of forming the storage node pads 110 is detailed in the following description.

As shown in FIG. 6, after the air gaps AG are formed, the pattern transferring layer PT is formed to cover the conductive pattern 108 and the bit line structures BL. Specifically, the pattern transferring layer PT covers the conductive strips 108a, the bit line structures BL, the first spacers SP1, the second spacers SP2, the insulation patterns 104 and the air gaps AG in the memory cell region R1 and also covers the conductive block 108b in the peripheral region R2. The pattern transferring layer PT may include for example silicon nitride, but not limited thereto. It is noted that since a width of the air gap AG is small enough, such as 2 nanometers, the pattern transferring layer PT may cover the air gaps AG and will not fill into the air gaps AG.

Subsequently, as shown in FIG. 7 and FIG. 8, a mask pattern MP is formed on the pattern transferring layer PT. In this embodiment, the mask pattern MP may include a plurality of strip patterns SP extending along the first direction D1 and corresponding to the storage node contacts SC and the insulation patterns 104. In other words, each strip pattern SP is disposed in the memory cell region R1 and on the storage node contacts SC and the insulation patterns 104 arranged in the same first direction D1; that is, each strip pattern SP is located on the storage node contacts SC and the insulation patterns in one row. Also, overlapping parts between the strip patterns SP extending along the first direction D1 and the conductive strips 108a extending along the second direction D2 define the positions of the storage node pads 110 respectively. The mask pattern MP further includes two blocks 112 disposed on the conductive block 108b in the peripheral region R1, in which each block 112 is disposed right on a corresponding one of the contact plugs CT respectively. For example, the mask pattern MP may be formed of tri-layer structure. In other words, an organic layer OL, a silicon-containing layer SH and a photoresist layer are sequentially formed on the pattern transferring layer PT and followed by patterning the photoresist layer to form a photoresist pattern. After that, the photoresist pattern is transferred to the silicon-containing layer SH and the organic layer OL to form the mask pattern MP. In another embodiment, when each conductive strip 108a extends along the first direction D1, each strip pattern SP may extend along the second direction D2 and cross the bit line structures BL, such that each strip pattern SP may be disposed on the storage node contacts SC in one column. In other words, overlapping parts between the strip patterns extending along the second direction D2 and the conductive strips 108a extending along the first direction D1 may define the positions of the storage node pads 110 respectively.

Following that, as shown in FIG. 9, the mask pattern MP is transferred to the pattern transferring layer PT to form a transfer pattern TP and expose the conductive pattern 108 on the bit line structures BL and the gate line GL. The mask pattern MP is then removed, but the present invention is not limited thereto. In another embodiment, the mask pattern MP may be removed in the following second etching process.

Thereafter, as shown in FIG. 10, a second etching process is performed to pattern the conductive pattern 108. In this embodiment, an etchant has an etching selectivity ratio of the transfer pattern TP relative to the conductive pattern 108 that is 1 may be utilized to etch the transfer pattern TP and the conductive pattern 108 at the same time, which means the etchant has an etching rate to the transfer pattern TP substantially the same as an etching rate to the conductive pattern 108, such that the conductive strips 108a on the bit line structures BL can be removed, and parts of each conductive strip 108a on the storage node contacts SC may remain. Accordingly, a plurality of storage node pads 110 are formed in the memory cell region R1. It is noted that when the conductive strips 108a on the bit line structures BL are removed, the first cap layers CL1, the first spacers SP1, the air gaps AG and the second spacers SP2 in the memory cell region R1 are exposed. In this embodiment, part of each first cap layer CL1, part of each first spacer SP1 and part of each second spacer SP2 may also be removed, so as to form a first recess RE1 on each bit line structure BL. It is worthy noted that since each first cap layer CL1 has a certain thickness, the top conductive layer BL2 is not exposed in the second etching process. Also, since the width of each air gap AG is small enough, each air gap AG will not be further widened or deepened by the second etching process. Besides, the second etching process may further etch the conductive block 108b on the gate line GL in the peripheral region R2 to form a pad 114 on each contact plug CT and an opening OP between the pads 114. The opening OP exposes the first insulation layer IN1. In this embodiment, the second etching process may selectively further etch a part of the first insulation layer IN1 to form a second recess RE2 on the first insulation layer IN1. The second recess RE2 doesn't penetrate through the first insulation layer IN1, so that the etch-stop layer ES is not exposed, and the gate line GL can be prevented from damage. In another embodiment, the first recesses RE1 and the second recess RE2 may not be formed in the second etching process.

As shown in FIG. 11 and FIG. 12, after patterning the conductive pattern 108, a second insulation layer IN2 is formed in the opening OP to form a semiconductor device 100 of this embodiment. The second insulation layer IN2 is not in contact with the etch-stop layer ES, and a part of the first insulation layer IN1 remains between the second insulation layer IN2 and the etch-stop layer ES. In this embodiment, the second insulation layer IN2 fills up the second recess RE2 and the opening OP, but the present invention is not limited thereto. Also, the second insulation layer IN2 is not in contact with each contact plug CT. Furthermore, the step of forming the second insulation layer IN2 may further form a fifth insulation layer IN5 in each first recess RE1.

Each fifth insulation layer IN5 may fill up the corresponding first recess RE1 and cover the corresponding air gaps AG.

To sum up, in the present invention, the air gap is formed between the storage node contact and the bit line structure, such that the RC delay effect between the bit line structure and the storage node contact can be reduced. Also, the conductive layer for forming the storage node pad is utilized to cover the first insulation layer on the peripheral circuit, and the sacrificial spacers are exposed by one of the patterning processes for forming the storage node pads, so that the air gaps can be formed under the condition that the peripheral circuit is not damaged. In addition, another one of the patterning processes for forming the storage node pads may be performed to form the storage node pads in the memory cell region and the pad in the peripheral region, so the semiconductor device with the air gaps and the peripheral circuit of the present invention may be formed without adding extra processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a semiconductor substrate having a memory cell region and a peripheral region;
a gate line disposed on the semiconductor substrate in the peripheral region;
an etch-stop layer covering the gate line and the semiconductor substrate in the peripheral region;
a first insulation layer covering the etch-stop layer;
two contact plugs disposed on the semiconductor substrate in the peripheral region and located at two sides of the gate line respectively, and the contact plugs penetrating through the etch-stop layer and the first insulation layer to contact the semiconductor substrate;
two pads disposed on the contact plugs respectively; and
a second insulation layer disposed between the pads, wherein the second insulation layer is not in contact with the etch-stop layer.

2. The semiconductor device according to claim 1, wherein the second insulation layer doesn't contact the contact plugs.

3. The semiconductor device according to claim 1, wherein the semiconductor substrate has a plurality of active regions disposed in the memory cell region, and the semiconductor device further comprises:
a bit line structure disposed on the semiconductor substrate in the memory cell region;
a first spacer disposed on a sidewall of the bit line structure; and
a storage node contact disposed at a side of the bit line structure, wherein the first spacer is disposed between the storage node contact and the bit line structure, and an air gap exists between the storage node contact and the first spacer.

4. The semiconductor device according to claim 3, further comprising a second spacer disposed between the air gap and the storage node contact.

* * * * *